United States Patent [19]

Brückmann

[11] Patent Number: 5,177,484
[45] Date of Patent: Jan. 5, 1993

[54] SWITCHED CAPACITOR OVERSAMPLING ANALOG/DIGITAL CONVERTER WITH NOISE FILTERING

[75] Inventor: Dieter Brückmann, Düsseldorf, Fed. Rep. of Germany

[73] Assignee: Siemens Aktiengesellschaft, Munich, Fed. Rep. of Germany

[21] Appl. No.: 713,464

[22] Filed: Jun. 10, 1991

[30] Foreign Application Priority Data

Jun. 12, 1990 [EP] European Pat. Off. ........... 90111111

[51] Int. Cl.[5] .............................................. H03M 3/00
[52] U.S. Cl. ..................... 341/172; 341/143; 333/173
[58] Field of Search ............... 341/143, 172; 375/26, 375/27, 34; 333/173

[56] References Cited

U.S. PATENT DOCUMENTS

| 4,704,600 | 11/1987 | Uchimura et al. | 341/143 |
| 4,876,542 | 10/1989 | Van Bavel et al. | 341/143 |
| 5,013,229 | 4/1992 | Ribner | 341/143 |

FOREIGN PATENT DOCUMENTS 0325926  8/1989  European Pat. Off. .

OTHER PUBLICATIONS

Matsuya et al.; "A 16-bit A-to-D Conversion Technology Using Triple Integration Noise Shaping"; IEEE Journal of Solid State Circuits; vol. SC-22 No. 6; Dec. 1987, pp. 921-929.

Larson et al.; "GaAs Switched-Capacitor Circuits for High Speed Signal Processing"; IEEE Journal of Solid State Circuits vol. SC-22 No. 6; Dec. 1987; pp. 971-981.

Nagaraj et al.; "Switched-Capacitor Circuits with Reduced Sensitivity to Amplifier Gain"; IEEE Transactions on Circuits and Systems; vol. CAS-34, No. 5; May 1987; pp. 571-574.

*Primary Examiner*—Howard L. Williams
*Attorney, Agent, or Firm*—Herbert L. Lerner; Laurence A. Greenberg

[57] ABSTRACT

An oversampling analog/digital converter includes a given number of at least three identically constructed switched-capacitor converter stages each being triggered by an analog input signal and each outputting both an analog and a digital output signal. The converter stages are connected in series with respect to the analog input and output signals. The given number of series-connected differentiation stages are each connected downstream of a respective one of the converter stages for receiving and adding the digital output signals of the converter stages.

6 Claims, 2 Drawing Sheets

SWITCHED CAPACITOR OVERSAMPLING ANALOG/DIGITAL CONVERTER WITH NOISE FILTERING

The invention relates to a switched capacitor oversampling analog/digital converter with noise filtering.

At present, high-resolution and highly linear analog/digital converters with resistor, transistor or capacitor networks can only be made with some form of calibration or correction. For some applications, analog/digital converters with oversampling and noise filtering therefore represent a practicable solution. Work is done with a higher sampling rate than that which is necessary according to the Nyquist theorem and lower resolution. In a following digital or in other words substantially non-critical filter, a low-frequency, high-resolution signal is then obtained from the high-frequency, low-resolution signal. As a result of the oversampling, all of the quantification noise is distributed over a wider frequency range, thus reducing the noise in the signal band range. In noise filtering, some of the quantification noise is shifted out of the signal band to other frequency ranges, thus further improving the signal-to-noise ratio in the signal band.

For noise filtering, integrator circuits are generally used, in which the signal-to-noise ratio improves with an increasing order of the integrator. However, typical third and higher order integrator circuits are essentially unstable. From an article by Yasuyuki Matsuya, Kuniharu Uchimura, Atsushi Iwata, Tsutomu Kobayashi, Masayuki Ishikawa and Takeshi Yoshitome, entitled "16-Bit Oversampling A-to-D Conversion Technology Using Triple-Integration Noise Shaping", in the IEEE Journal of Solid-State Circuits, Vol. SC-22, No. 6, pp. 921-929, Dec. 1978, it is known to form third order analog/digital converters with oversampling and noise filtering by a cascade connection of three first order converters, or in other words first order integrators. No stability problems occur at all in such analog/digital converters.

In order to further increase the insensitivity to parameter fluctuations, the known analog/digital converter is made by the switched capacitor technique instead of with RC elements, for determining the time constants, for instance the integrator time constants. The time constants are then no longer dependent on the absolute size of a resistor R and a capacitor C but rather on the ratio between two capacitors, which is subject to substantially smaller fluctuations. In analog/digital converters with oversampling, in principle work is done with a high clock frequency. The bandwidth of the integrators or of the operational amplifiers being used should in turn be higher than the clock frequency by a certain factor, in order to assure adequately accurate transient recovery of the integrators or operational amplifiers during each clock period. The bandwidth of the integrators or operational amplifiers must thus be considerably higher than the highest frequency to be processed. Moreover, however, high idling amplification is also needed to attain a compensatory effect, occurring with such converters, that leads to a reduction in the quantification noise. High amplification factors, particularly in integrated CMOS operational amplifiers, are attainable only at very high engineering costs and at the expense of speed and thus bandwidth of the operational amplifiers. In order to keep down the demands made of the operational amplifiers in the known analog/digital converter, the ratio in capacitance of the two associated capacitors was increased in the integrators. However, that restricts the control range of the analog/digital converter.

From an article by K. Nagaraj, T. R. Viswanathan, K. Singhal and J. Vlach, entitled "Switched-Capacitor Circuits with Reduced Sensitivity to Amplifier Gain", in the IEEE Transactions on Circuits and Systems, Vol. CAS-34, No. 5, May 1987, pp. 571-574, a switched-capacitor integrator is known in which the sensitivity to the influences of finite idling amplification of the operational amplifiers is greatly reduced. In that integrator, in both clock phases, the input voltage is stored on one or the other capacitor at a time, namely on a first or a second capacitor. In every other phase, an integration step then occurs, and the first capacitor is discharged through a third capacitor. As a result of the finite idling amplification of the operational amplifier, offset voltages and offset currents occur at its inputs, which prevent complete discharge of the first capacitor, so that the integration step entails loss. The voltage occurring between the inputs of the operational amplifier is simultaneously stored on a fourth capacitor. The integration step itself then follows in the ensuing clock phase. In other words, the second capacitor is discharged through a fifth capacitor. The second capacitor is connected through the fourth capacitor and not directly to the negative input of the operational amplifier. Thus the offset voltage of the input of the operational amplifier is compensated for, so that complete discharging of the second capacitor takes place. Accordingly, the circuit behaves as if the operational amplifier had infinite idling amplification.

It is accordingly an object of the invention to provide a switched-capacitor oversampling analog/digital converter with noise filtering, which overcomes the hereinafore-mentioned disadvantages of the heretofore-known devices of this general type and which modifies the known integrator and the known analog/digital converter with oversampling and noise filtration in such a way that a combination of the two is possible.

With the foregoing and other objects in view there is provided, in accordance with the invention, an oversampling analog/digital converter, comprising a given number of at least three identically constructed converter stages each being triggered by an analog input signal and each outputting both an analog and a digital output signal; the converter stages being connected in series with respect to the analog input and output signals; the given number of series-connected differentiation stages each being connected downstream of a respective one of the converter stages for receiving and adding the digital output signals of the converter stages; each of the converter stages having an operational amplifier with inverting and non-inverting inputs and with an output supplying the analog output signal of the respective converter stage, a comparator connected downstream of the operational amplifier, and a storage element connected downstream of the comparator, the storage element having one output supplying the digital output signal of the respective converter stage and another output supplying an inverted digital output signal; each of the converter stages having first through fourteenth controllable switches and first through fifth capacitors each with two terminals; in each of the converter stages the first switch receiving the respective analog signal and being connected to one of the terminals of the first capacitor, the second and third switches receiving a first reference potential and being connected in series to the one terminal of the first capacitor, the fourth switch receiving the respective analog signal and being connected to one of the terminals of the second capacitor, the fifth and sixth switch receiving a second reference potential and being connected to the one terminal of the second capacitor; in each of the converter stages the seventh switch receiving a reference potential and being connected to the other of the terminals of the first capacitor, the eighth switch being connected to the other terminal of the first capacitor, the ninth switch receiving the reference potential and being connected to the eighth switch, one of the terminals of the third capacitor being connected to the eighth switch, the other of the terminals of the third capacitor being connected to the inverting input of the operational amplifier; in each of the converter stages the tenth switch receiving the reference potential and being connected to the other of the terminals of the second capacitor, and the eleventh switch being connected between the other terminal of the second capacitor and the inverting input of the operational amplifier; in each of the converter stages the twelfth switch and the fourth capacitor being connected in series between the output of the operational amplifier and the one terminal of the third capacitor, the fifth capacitor being connected to the output of the operational amplifier, the thirteenth switch receiving the reference potential and being connected to the fifth capacitor, and the fourteenth switch being connected between the fifth capacitor and the inverting input of the operational amplifier; in each of the converter stages the first and fourth switches being controlled by a first clock signal; the sixth, ninth, eleventh and fourteenth switches being controlled by a second clock signal; the third and eighth switches being controlled by a third clock signal; the seventh switch being controlled by a fourth clock signal; the tenth, twelfth and thirteenth switches being controlled by a fifth clock signal; the fifth switch being controlled by the inverted digital output signal and the second switch being controlled by the digital output signal; and the first, second and third clock signals being successively occurring, cyclically recurring pulses effecting switching through of the respectively assigned switches, and the fourth and fifth clock signals being pulses effecting switching through of the respectively assigned switches, the fourth clock signal beginning with a pulse of the first clock signal and ending with a pulse of the second clock signal, and the fifth clock signal beginning with a pulse of the third clock signal and ending with a pulse of the first clock signal.

In accordance with another feature of the invention, each of the converter stages includes sixth and seventh capacitors each having two terminals, and two further parallel-connected switches; in each of the converter stages one of the terminals of the seventh capacitor is connected to the output of the operational amplifier, one of the terminals of the sixth capacitor is connected to the inverting input of the operational amplifier, the other of the terminals of the sixth and seventh capacitors are connected to one another, one of the further parallel-connected switches receives the reference potential, is connected to the other terminal of the sixth capacitor and is controlled by the second clock signal, and the other of the further parallel-connected switches receives the reference potential, is connected to the other terminal of the seventh capacitor and is controlled by the fifth clock signal.

In accordance with a further feature of the invention, the pulses of the first, second and third clock signals do not overlap.

In accordance with a concomitant feature of the invention, the converter stages have outputs carrying the digital output signals, and the outputs of each two adjacent converter stages are coupled with one another through one of the differentiation stages, for adding respective output signals of one of the differentiation stages to the digital output signal of one of the converter stages and delivering the added signals to the next on of the differentiation stages in succession.

The advantages of an analog/digital converter according to the invention are high stability, low expenditure for circuitry, low sensitivity to component fluctuations and external interference, and a wider control range.

Other features which are considered as characteristic for the invention are set forth in the appended claims.

Although the invention is illustrated and described herein as embodied in a switched-capacitor oversampling analog/digital converter with noise filtering, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
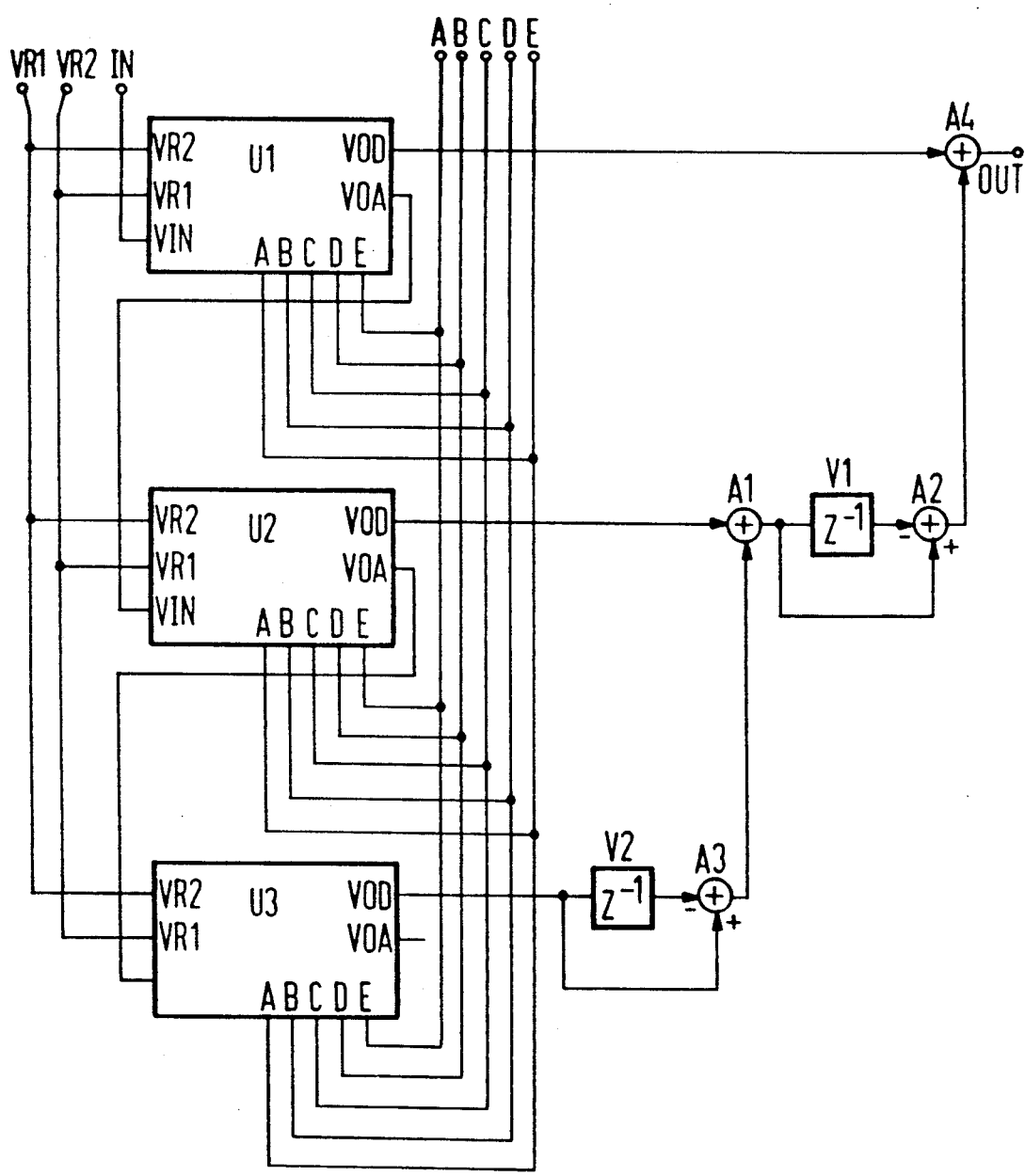
FIG. 1 is a schematic and block circuit diagram of an embodiment of a switched capacitor oversampling analog/digital converter with noise filtering according to the invention.

Referring now to the figures of the drawing in detail and first, particularly, to FIG. 1 thereof, there is seen an exemplary embodiment of a third order analog/digital converter with oversampling and noise filtration, which includes three identically constructed converter stages U1, U2, U3, each of the first order. Two reference potentials VR1, VR2 and five clock signals A, B, C, D, E are applied to each of the three converter stages U1, U2, U3. An input signal IN of the analog/digital converter is provided as an input signal VIN for the converter stage U1. An output signal VOA of the converter stage U1 is provided as an input signal for the converter stage U2. An output signal VOA of the converter stage U2 is provided as an input signal for the converter stage U3. An output signal VOD of the converter stage U3 is applied both to an input of a delay element V2 and to one input of an adder A3. Another input of the adder A3 is connected to an output of the delay element V2. An output of the adder A3 is carried to one input of an adder A1. Another input of the adder A1 is triggered by an output signal VOD of the converter stage U2. An output of the adder A1 is connected to both an input of a delay element V1 and to one input of an adder A2. Another input of the adder A2 is connected an output of the delay element V1. An adder A4 has one input connected to an output of the adder A2 and another input to which an output signal VOD of the converter stage U1 is applied. An output signal of the adder A4 is provided as an output signal OUT of the analog/digital converter.

The delay element V1 combined with the adder A2, and the delay element V2 combined with the adder A3 each form digital differentiation stages. In the exemplary embodiment, the differentiation stages are connected in such a way that outputs of adjacent converter stages U1, U2, U3 carrying digital output signals VOD are each coupled with one another through a respective differentiation stage, in such a way that in each case the output signal of one differentiation stage is added to the digital output signal VOD of a converter stage U1, U2, U3 and delivered to the next differentiation stage in succession. An advantage over devices in which the digital output signals VOD of the converter stages U1, U2, U3 are each carried through a corresponding number of differentiation stages and then added up, with the number being equal to the number of preceding converter stages, is that the total number of differentiation stages and therefore the expense for circuitry is reduced, especially since the respective adders A1 and A3, and A2 and A4 can each also be combined to make one adder, given a suitable structure.

Figure 2:
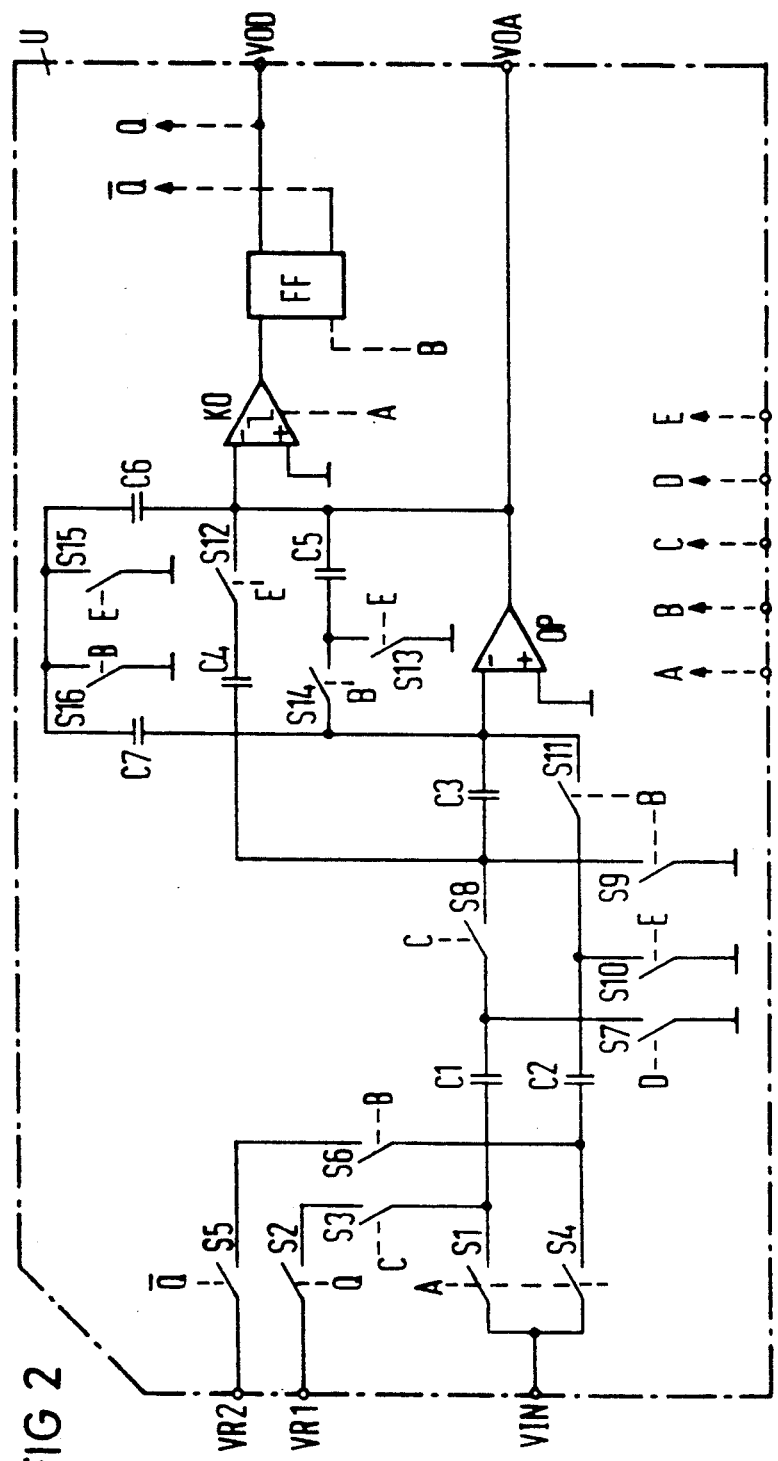
FIG. 2 is a schematic circuit diagram of a converter stage according to the invention in the analog/digital converter of FIG. 1.

The converter stages U1, U2, U3 are identical in structure. An exemplary embodiment of such a converter stage U of the switched-capacitor type is shown in FIG. 2 of the drawing. The input signal VIN is carried through a controllable electronic switch S1 to one terminal of a capacitor C1 and also through a controllable electronic switch S4 to one terminal of a capacitor C2. The reference potential VR1 can also be applied to one terminal of the capacitor C1 through series-connected controllable electronic switches S2 and S3. Correspondingly, the reference potential VR2 can also be applied to one terminal of the capacitor C2 through series-connected controllable electronic switches S5 and S6. A controllable electronic switch S8 is connected between the other terminal of the capacitor C1 and one terminal of a capacitor C3. A controllable electronic switch S11 is connected between the other terminal of the capacitor C2 and the other terminal of the capacitor C3. Furthermore, the other terminal of the capacitor C1, the other terminal of the capacitor C2, and the one terminal of the capacitor C3 can each be connected to the reference potential through a respective controllable electronic switch S7, S10 and S9. The other terminal of the capacitor C3 is connected to an inverting input of an operational amplifier OP, having a non-inverting input which is at reference potential and an output which carries the output signal VOA. A feedback network is connected between the output of the operational amplifier OP and its inverting input. This network includes a capacitor C5 having one terminal which is connected to reference potential through a controllable electronic switch S13 and can be connected to the inverting input through a controllable electronic switch S14. Another terminal of the capacitor C5 is connected to the output of the Operational amplifier OP. Finally, the output of the operational amplifier OP is connected through a series circuit including a capacitor C4 and a controllable electronic switch S12, to the one terminal of the capacitor C3. According to a feature of the invention, a further feedback network is connected parallel to this feedback network. The further feedback network has a series circuit of two capacitors C6 and C7 connected between the inverting input and the output of the operational amplifier OP. Each of the interconnected terminals of the capacitors C6 and C7 are furthermore capable of being connected to reference potential through a respective controllable electronic switch S15 and S16. The additional feedback network prevents failure of feedback of the operational amplifier between the switch phases of the controllable electronic switches S12, S13, S14, which would make it unstable. The output signal VOA is carried to an inverting input of a comparator KO having a non-inverting input which is at reference potential, and an output to which a flip-flop FF that is provided as a storage element, is connected. Inverting and non-inverting outputs of the flip-flop FF carry respective clock signals $\overline{Q}$ and Q, while the clock signal Q is also provided as the output signal VOD.

The controllable electronic switches may be designated as first through fourteenth switches in the following order: S1, S3, S4, S5, S6, S7, S8, S9, S10, S11, S12, S13 and S14. The controllable electronic switches S15 and S16 may be designated as further electronic switches. The capacitors may be designated as first through seventh capacitors in the following order: C1, C2, C3, C4, C5, C6 and C7.

The clock signals Q, $\overline{Q}$, like the clock signals A, B, C, D, E, serve to control the electronic switches S1 to S16. The clock signal A is provided for controlling the electronic switches S1 and S4 and the comparator KO; the clock signal B is provided for controlling the electronic switches S6, S9, S11, S14, S16 and the flip-flop FF; the clock signal C is provided for controlling the electronic switches S3 and S8; the clock signal D is provided for controlling the electronic switch S7; and the clock signal E is provided for controlling the electronic switches S10, S12, S13 and S15. The electronic switch S5 is controlled by the clock signal $\overline{Q}$, and the electronic switch S2 is controlled by the clock signal Q.

Figure 3:
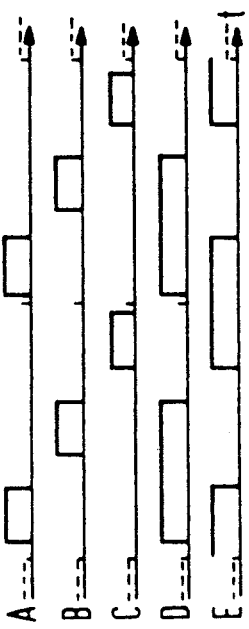
FIG. 3 is a clock diagram of the analog/digital converter of FIG. 1.

The course of the clock signals A, B, C, D and E over time t is shown in FIG. 3. These clock signals are periodic. In other words, pulses of defined duration recur at defined time intervals. The clock signals A, B and C are disposed in a chronological relationship with one another in such a way that first a pulse occurs at the clock signal A, then a pulse at the clock signal B, and subsequently a pulse at the clock signal C, in turn. Then, a pulse recurs at the clock signal A, and so forth. The clock signals A, B and C are non-overlapping. In other words, the rise of the pulse in a successive clock signal does not occur until after the pulse for an earlier clock signal fades. The non-overlapping clock signals A, B, C eliminate any influence of the finite switching times of the electronic switches upon the behavior of the analog/digital converter. At the clock signal D, a pulse is output that begins simultaneously with the pulse of the clock signal A and ends simultaneously with the pulse of the clock signal B. Finally, at the clock signal E, a pulse is output that begins simultaneously with the pulse of the clock signal C and ends simultaneously with the pulse of the clock signal A. There is no precise temporal relationship to be disclosed for the clock signals Q and $\overline{Q}$, because these clock signals are also dependent on the input signal VIN.

In closing, it should be pointed out that stable oversampling analog/digital converters of higher order can be made by adding further converter stages and associated differentiation stages.

I claim:

1. An oversampling analog/digital converter, comprising a given number of at least three identically constructed converter stages each being triggered by an analog input signal and each outputting both an analog and a digital output signal;

said converter stages being connected in series with respect to the analog input and output signals and forming a given number of series-connected differentiation stages;

said given number of series-connected differentiation stages each being connected downstream of a respective one of said converter stages for receiving and adding the digital output signals of said converter stages;

each of the converter stages having an operational amplifier with inverting and non-inverting inputs and with an output supplying the analog output signal of said respective converter stage, a comparator connected downstream of said operational amplifier, and a storage element connected downstream of said comparator, said storage element having one output supplying the digital output signal of said respective converter stage and another output supplying an inverted digital output signal;

each of said converter stages having first through fourteenth controllable switches and first through fifth capacitors each with two terminals;

in each of said converter stages said first switch receiving the respective analog signal and being connected to one of the terminals of said first capacitor, the second and third switches receiving a first reference potential and being connected in series to the one terminal of said first capacitor, said fourth switch receiving the respective analog signal and being connected to one of the terminals of said second capacitor, said fifth and sixth switch receiving a second reference potential and being mutually connected in series and to the one terminal of said second capacitor;

in each of the converter stages said seventh switch receiving a third reference potential and being connected to the other of the terminals of said first capacitor, said eighth switch being connected to the other terminal of said first capacitor, said ninth switch receiving the third reference potential and being connected to said eighth switch, one of the terminals of said third capacitor being connected to said eighth switch, the other of the terminals of said third capacitor being connected to the inverting input of said operational amplifier;

in each of said converter stages said tenth switch receiving the third reference potential and being connected to the other of the terminals of said second capacitor, and said eleventh switch being connected between the other terminal of said second capacitor and the inverting input of said operational amplifier;

in each of said converter stages the twelfth switch and said fourth capacitor being connected in series between the output of said operational amplifier and the one terminal of said third capacitor, said fifth capacitor being connected to the output of said operational amplifier, said thirteenth switch receiving the third reference potential and being connected to said fifth capacitor, and said fourteenth switch being connected between said fifth capacitor and the inverting input of said operational amplifier;

in each of said converter stages said first and fourth switches being controlled by a first clock signal; said sixth, ninth, eleventh and fourteenth switches being controlled by a second clock signal; said third and eighth switches being controlled by a third clock signal; said seventh switch being controlled by a fourth clock signal; said tenth, twelfth and thirteenth switches being controlled by a fifth clock signal; said fifth switch being controlled by the inverted digital output signal and said second switch being controlled by the digital output signal; and the first, second and third clock signals being successively occurring, cyclically recurring pulses effecting switching of said respectively assigned switches, and the fourth and fifth clock signals being pulses effecting switching of said respectively assigned switches, the fourth clock signal beginning with a pulse of the first clock signal and ending with a pulse of the second clock signal, and the fifth clock signal beginning with a pulse of the third clock signal and ending with a pulse of the first clock signal.

2. The analog/digital converter according to claim 1, wherein each of said converter stages includes sixth and seventh capacitors each having two terminals, and two further parallel-connected switches; in each of said converter stages one of the terminals of said sixth capacitor is connected to the output of said operational amplifier, one of the terminals of said seventh capacitor is connected to the inverting input of said operational amplifier, the other of the terminals of said sixth and seventh capacitors are connected to one another, one of said further parallel-connected switches receives the third reference potential, is connected to the other terminal of said sixth capacitor and is controlled by the fifth clock signal, and the other of said further parallel-connected switches receives the third reference potential, is connected to the other terminal of said seventh capacitor and is controlled by the second clock signal.

3. The analog/digital converter according to claim 2, wherein the pulses of the first, second and third clock signals do not overlap.

4. The analog/digital converter according to claim 2, wherein the pulses of the first, second and third clock signals do not overlap.

5. The analog/digital converter according to claim 1, wherein said converter stages have outputs carrying the digital output signals, and the outputs of each two adjacent converter stages are coupled with one another through one of said differentiation stages, for adding respective output signals of one of said differentiation stages to the digital output signal of one of said converter stages and delivering the added signals to the next one of said differentiation stages in succession.

6. The analog/digital converter according to claim 1, wherein a given number of series-connected differentiation stages are connected downstream of each of said converter stages, said given number being equal to said given number of converter stages.

* * * * *